(12) United States Patent
Hsu et al.

(10) Patent No.: US 8,089,294 B2
(45) Date of Patent: Jan. 3, 2012

(54) MEMS PROBE FABRICATION ON A REUSABLE SUBSTRATE FOR PROBE CARD APPLICATION

(75) Inventors: Tseng-Yang Hsu, San Marino, CA (US); Cao Ngoc Lam, El Monte, CA (US)

(73) Assignee: WinMENS Technologies Co., Ltd., Taipei (TW)

( * ) Notice: Subject to any disclaimer, the term of this patent is extended or adjusted under 35 U.S.C. 154(b) by 714 days.

(21) Appl. No.: 12/186,458

(22) Filed: Aug. 5, 2008

(65) Prior Publication Data

US 2010/0033201 A1 Feb. 11, 2010

(51) Int. Cl.
*G01R 31/26* (2006.01)
(52) U.S. Cl. ............... 324/761.01; 324/762.01; 324/500
(58) Field of Classification Search .......................... None
See application file for complete search history.

(56) References Cited

U.S. PATENT DOCUMENTS

| | | | |
|---|---|---|---|
| 4,151,945 A | 5/1979 | Ragard et al. |
| 4,528,500 A | 7/1985 | Lightbody et al. |
| 4,773,877 A | 9/1988 | Kruger et al. |
| 4,841,240 A | 6/1989 | Hsue et al. |
| 5,100,338 A | 3/1992 | Lu |
| 5,177,438 A | 1/1993 | Littlebury et al. |
| 5,286,208 A | 2/1994 | Matsuoka |
| 5,465,611 A | 11/1995 | Ruf et al. |
| 5,798,283 A | 8/1998 | Montague et al. |
| 6,359,455 B1 | 3/2002 | Takekoshi |
| 6,520,778 B1 | 2/2003 | Eldridge et al. |
| 6,521,970 B1 | 2/2003 | Takiar et al. |
| 6,555,400 B2 | 4/2003 | Farnworth et al. |
| 6,672,875 B1 | 1/2004 | Mathieu et al. |
| 6,680,536 B2 | 1/2004 | Hattori et al. |
| 6,784,680 B2 | 8/2004 | Haga et al. |
| 6,807,734 B2 | 10/2004 | Eldridge et al. |
| 6,861,277 B1 | 3/2005 | Monroe et al. |
| 6,965,245 B2 | 11/2005 | Kister et al. |
| 7,047,638 B2 | 5/2006 | Eldridge et al. |
| 7,048,548 B2 | 5/2006 | Mathieu et al. |
| 7,078,921 B2 | 7/2006 | Haga et al. |
| 7,151,385 B2 | 12/2006 | Hirata et al. |
| 7,156,706 B2 | 1/2007 | Brown et al. |
| 7,190,179 B2 | 3/2007 | Haga et al. |
| 7,267,557 B2 | 9/2007 | Chen |
| 7,271,022 B2 | 9/2007 | Tang et al. |
| 7,285,966 B2 | 10/2007 | Lee et al. |
| 7,349,223 B2 | 3/2008 | Haemer et al. |
| 7,377,788 B2 | 5/2008 | Hasegawa |

(Continued)

OTHER PUBLICATIONS

Winmems Technologies Holdings Co, Final Office Action mailed Sep. 1, 2011 for U.S. Appl. No. 11/951,772., 14 pages.

*Primary Examiner* — Jermele M Hollington
*Assistant Examiner* — Trung Nguyen
(74) *Attorney, Agent, or Firm* — Blakely, Sokoloff, Taylor & Zafman

(57) ABSTRACT

A Micro-Electro-Mechanical-Systems (MEMS) probe is fabricated on a substrate for use in a probe card. The probe has a bonding surface to be attached to an application platform of the probe card. The bonding surface is formed on a plane perpendicular to a surface of the substrate. An undercut is formed beneath the probe for detachment of the probe from the substrate.

20 Claims, 15 Drawing Sheets

U.S. PATENT DOCUMENTS

| | | |
|---|---|---|
| 7,474,110 B2 | 1/2009 | Mochizuki et al. |
| 7,503,811 B2 | 3/2009 | Seo et al. |
| 7,511,523 B2 * | 3/2009 | Chen et al. ............... 324/755.01 |
| 7,532,020 B2 | 5/2009 | Hasegawa et al. |
| 7,553,165 B2 | 6/2009 | Mathieu et al. |
| 7,555,836 B2 | 7/2009 | Mathieu et al. |
| 7,567,089 B2 | 7/2009 | Chen et al. |
| 7,586,321 B2 | 9/2009 | Hirakawa et al. |
| 7,633,306 B2 | 12/2009 | Strom et al. |
| 7,644,490 B1 | 1/2010 | Niblock et al. |
| 7,714,235 B1 | 5/2010 | Pedersen et al. |
| 7,721,429 B2 | 5/2010 | Soma et al. |
| 7,721,430 B2 | 5/2010 | Chartarifsky et al. |
| 7,737,714 B2 | 6/2010 | Hsu |
| 7,776,631 B2 | 8/2010 | Miles |
| 7,811,849 B2 | 10/2010 | Hsu |
| 2002/0080588 A1 | 6/2002 | Eldridge et al. |
| 2002/0163051 A1 | 11/2002 | Gopal et al. |
| 2003/0046810 A1 | 3/2003 | Farnworth et al. |
| 2003/0113990 A1 | 6/2003 | Grube et al. |
| 2004/0245588 A1 | 12/2004 | Nikkel et al. |
| 2005/0106772 A1 | 5/2005 | Monroe et al. |
| 2005/0176212 A1 | 8/2005 | Monroe et al. |
| 2006/0134819 A1 | 6/2006 | Tang et al. |
| 2006/0191136 A1 | 8/2006 | Eldridge et al. |
| 2006/0192581 A1 | 8/2006 | Lee |
| 2007/0018666 A1 | 1/2007 | Barabi et al. |
| 2007/0245552 A1 | 10/2007 | Caldwell et al. |
| 2007/0256299 A1 | 11/2007 | Chartarifsky et al. |
| 2007/0290698 A1 | 12/2007 | Mochizuki et al. |
| 2008/0007282 A1 | 1/2008 | Hasegawa et al. |
| 2008/0036449 A1 | 2/2008 | Kimoto |
| 2008/0111573 A1 | 5/2008 | Chen et al. |
| 2008/0115353 A1 | 5/2008 | Mathieu et al. |
| 2008/0184559 A1 | 8/2008 | Soma et al. |
| 2009/0040911 A1 * | 2/2009 | Chou et al. .................... 369/126 |
| 2009/0144970 A1 | 6/2009 | Hsu et al. |

* cited by examiner

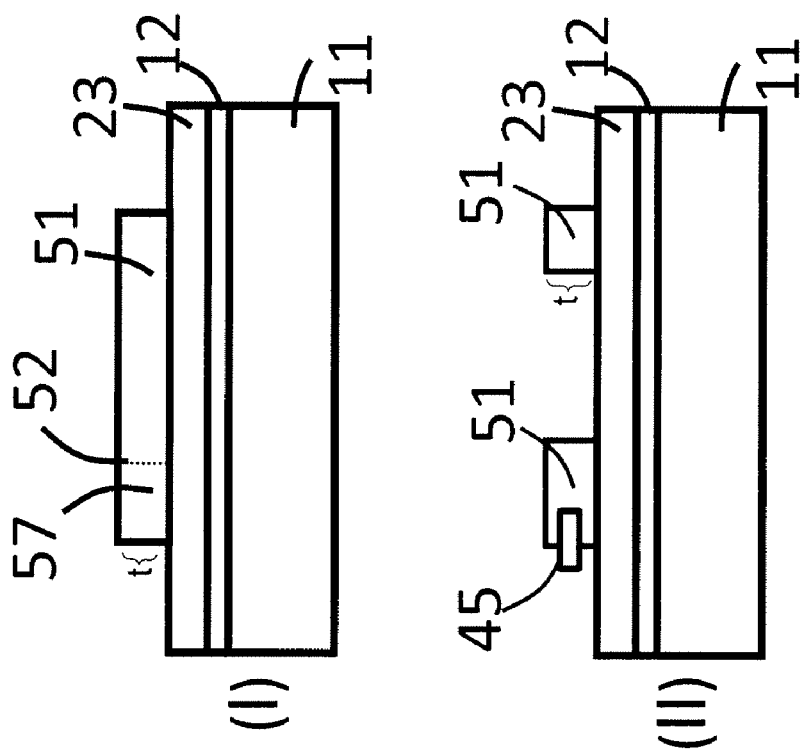
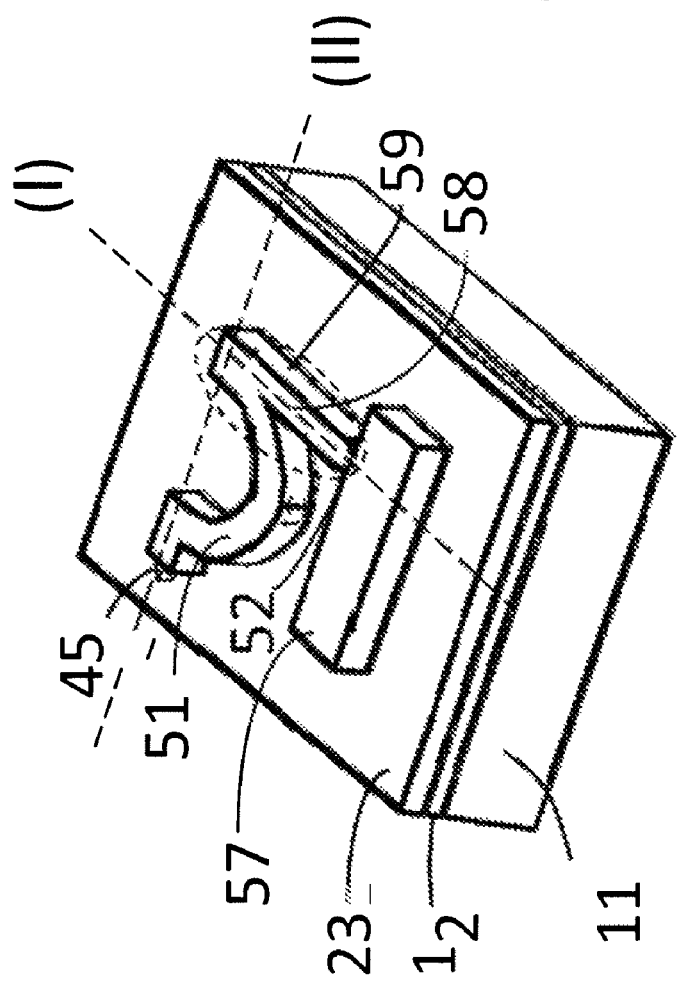
FIG. 5A
FIG. 5B

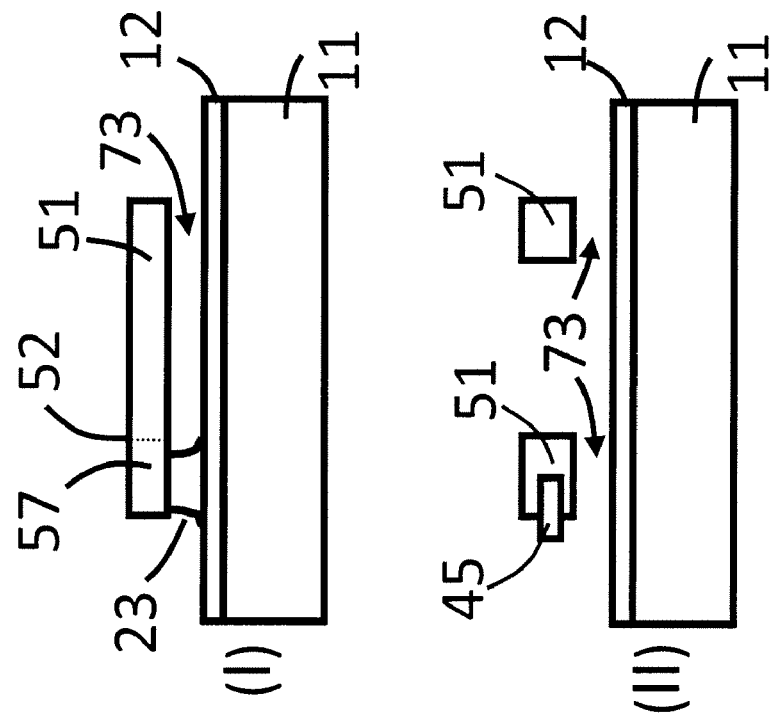
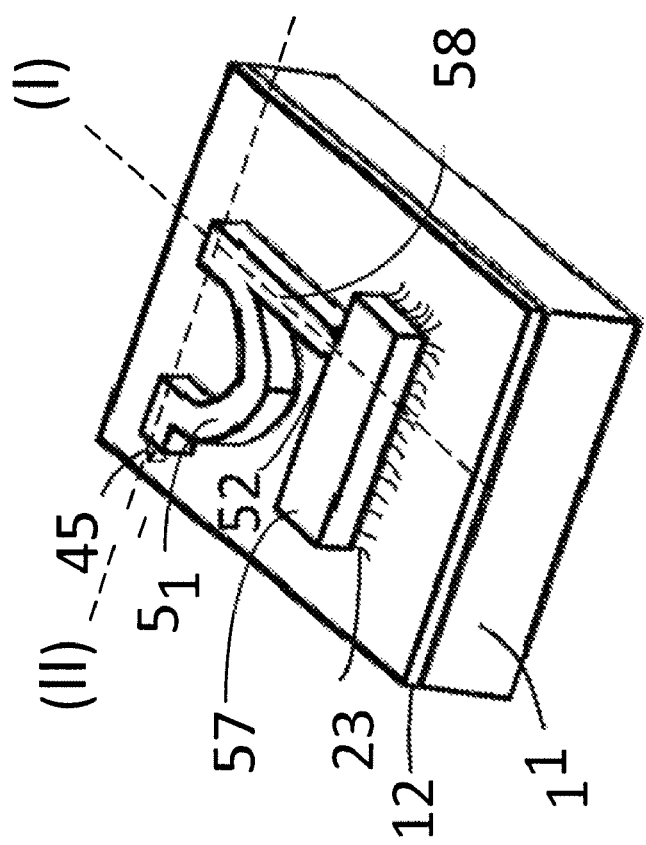
FIG. 7A
FIG. 7B

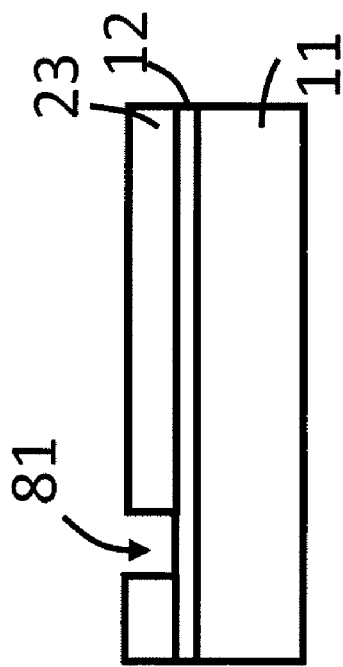
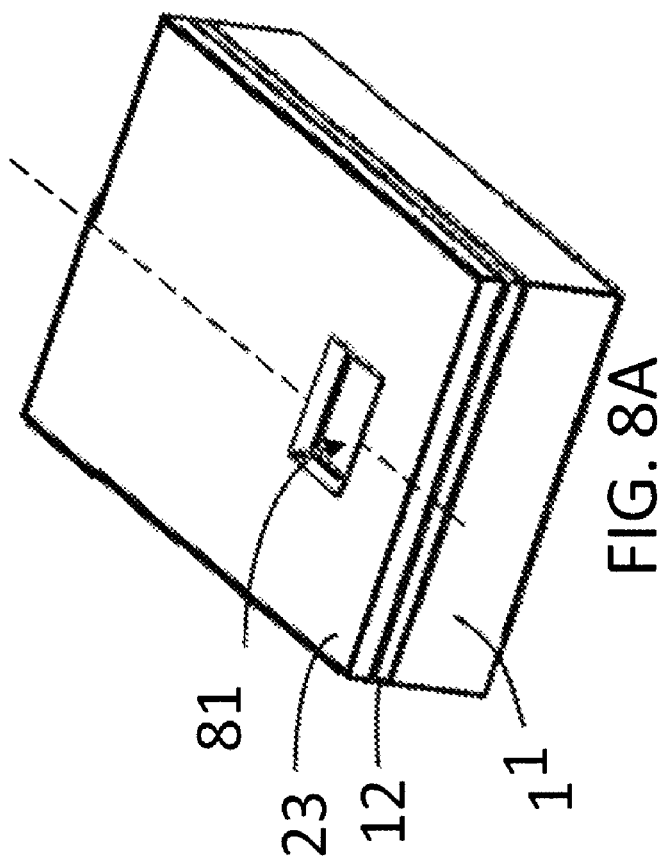

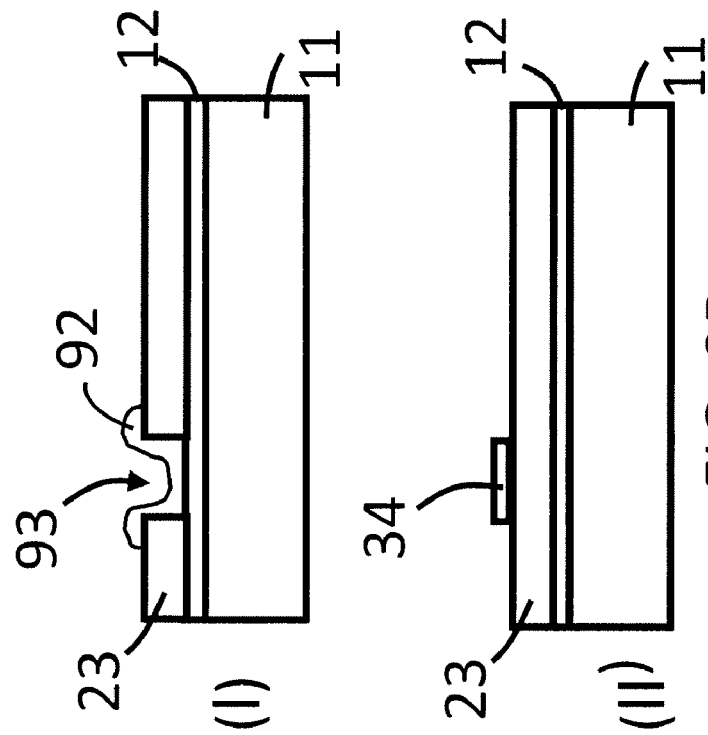
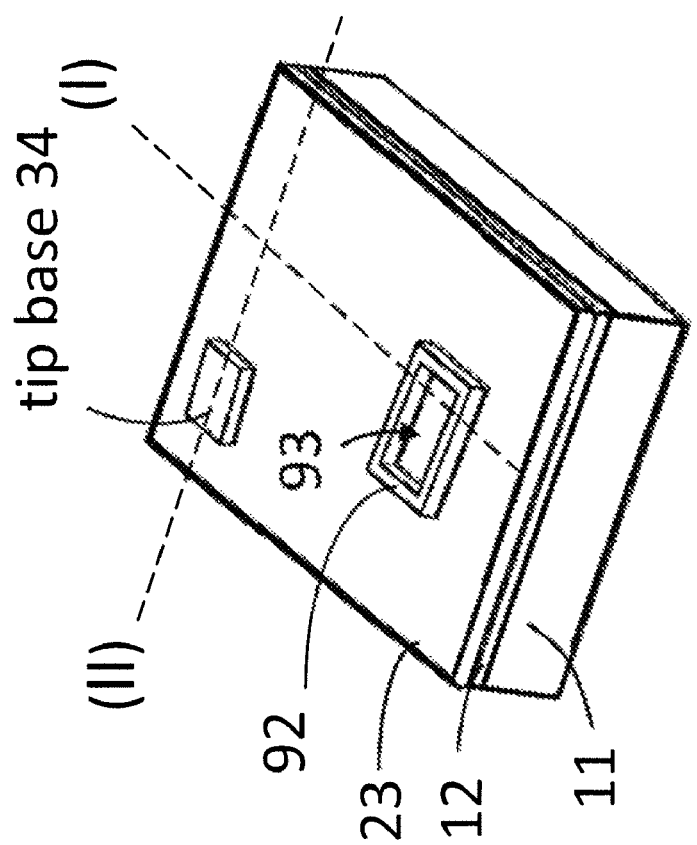
FIG. 9A
FIG. 9B

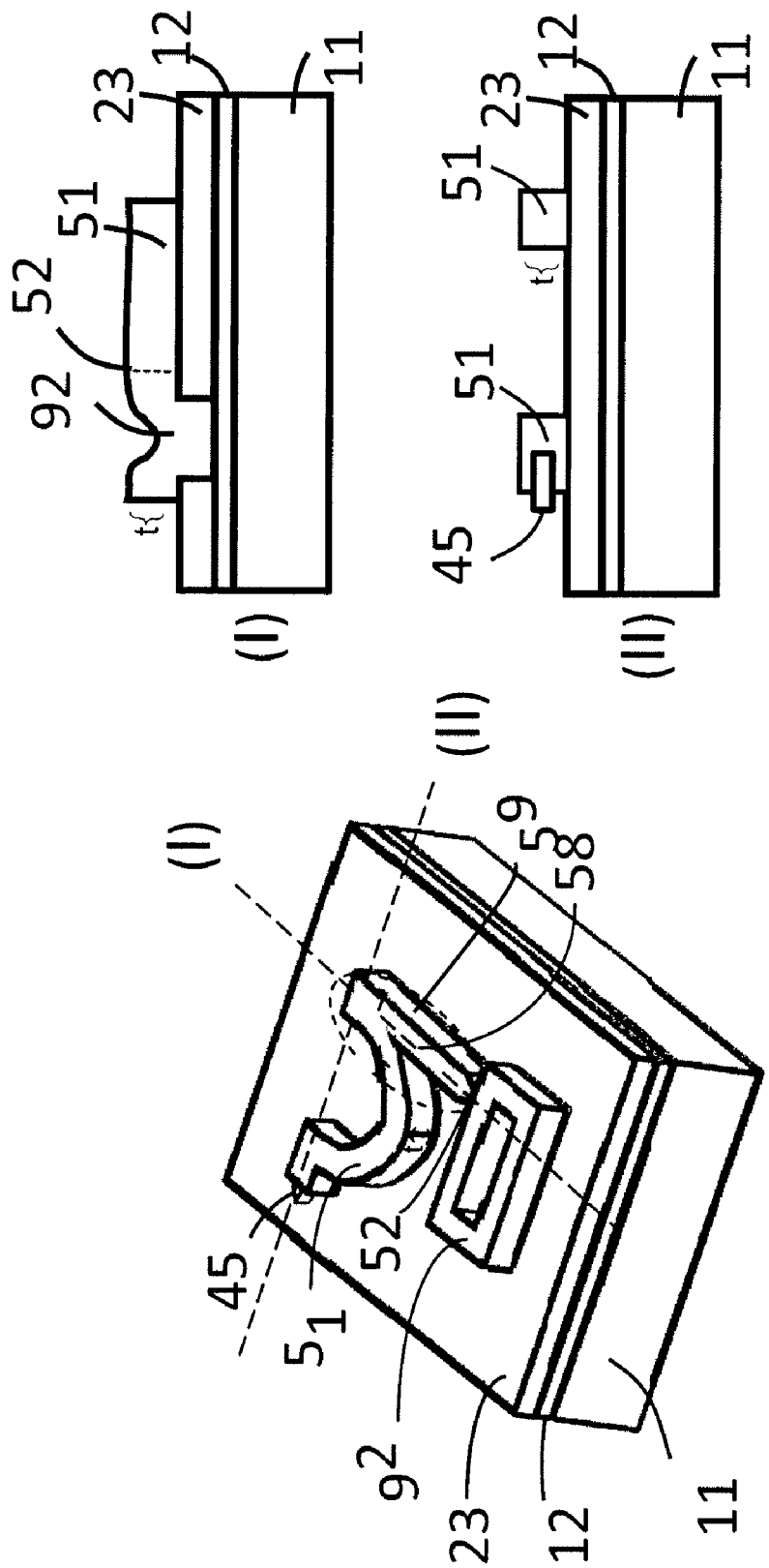

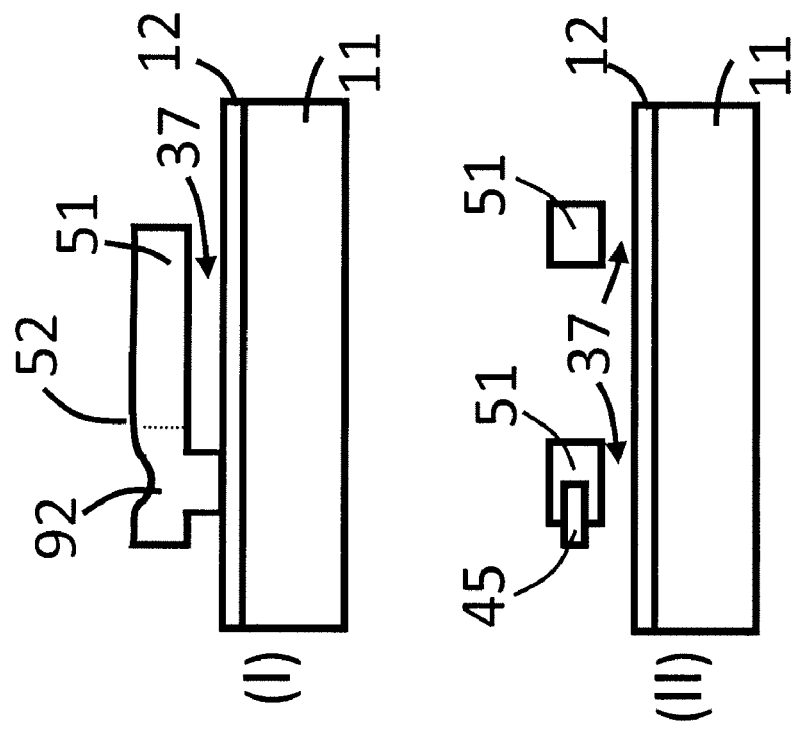
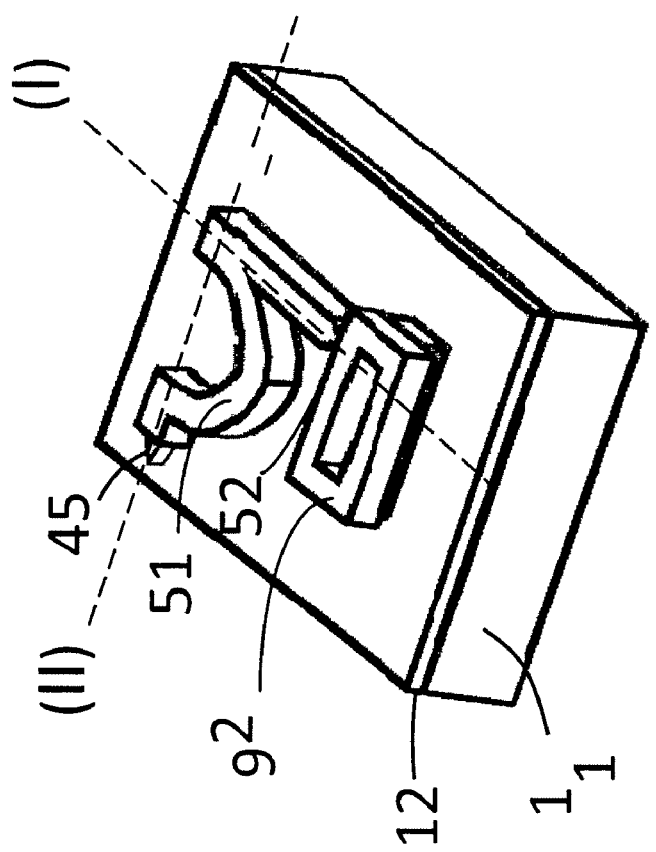
FIG. 13A
FIG. 13B

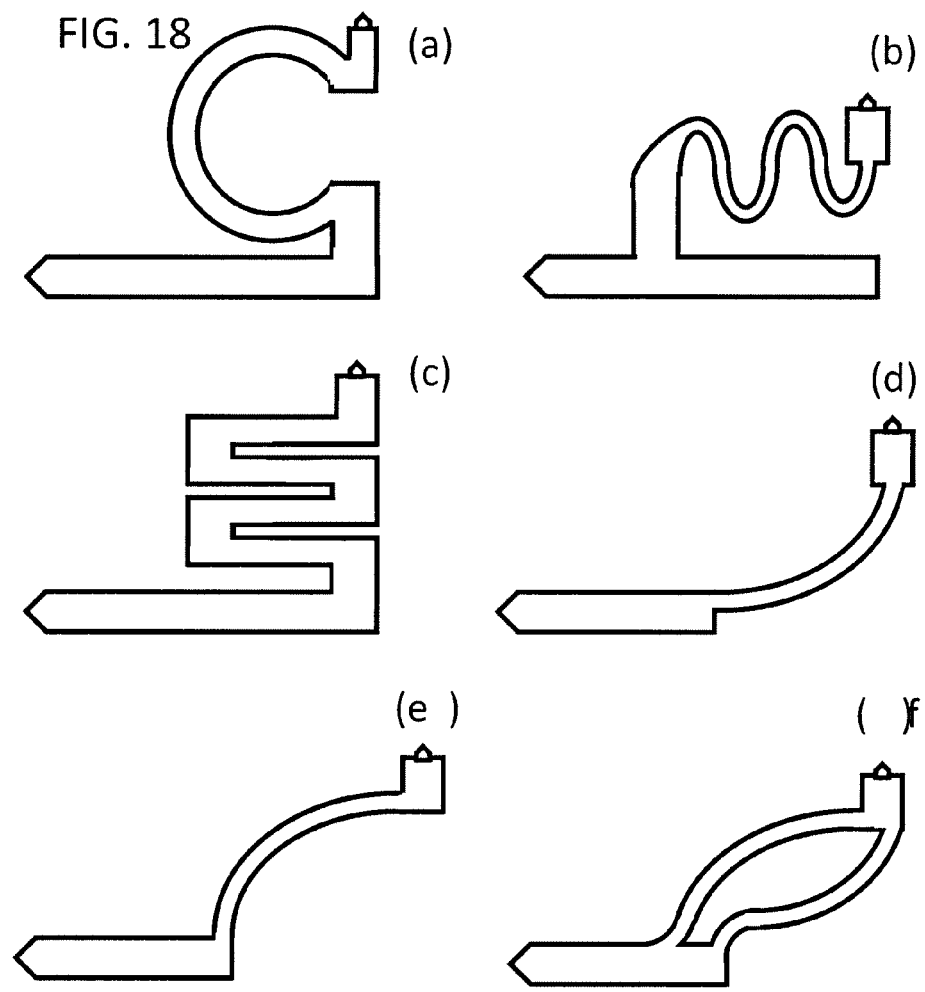

FIG. 19
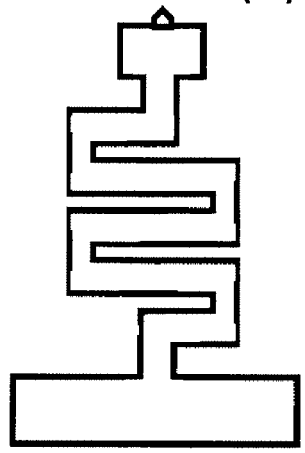 (a)  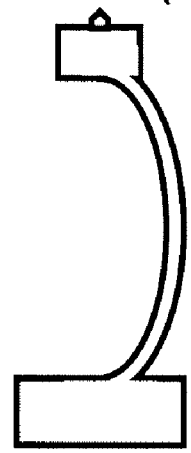 (b)  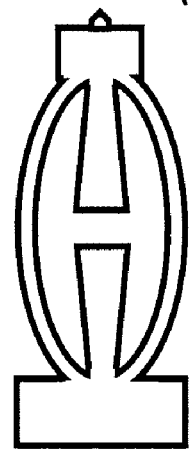 (c)
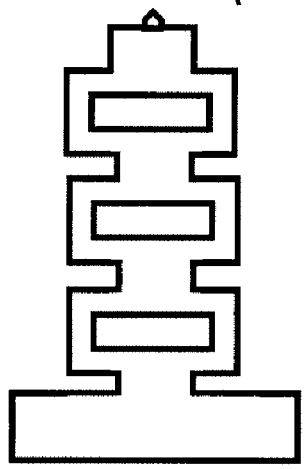 (d )  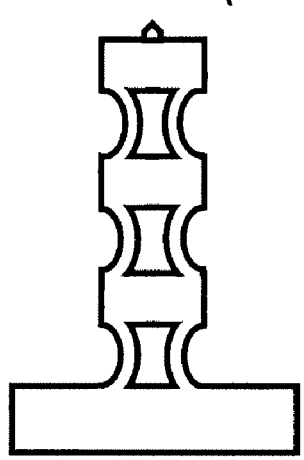 (e )

MEMS PROBE FABRICATION ON A REUSABLE SUBSTRATE FOR PROBE CARD APPLICATION

FIELD OF THE INVENTION

At least one embodiment of the present invention pertains to Micro-Electro-Mechanical Systems (MEMS), and more particularly, to the formation of a MEMS probe.

BACKGROUND

Micro-Electro-Mechanical Systems (MEMS) is the integration of mechanical elements, sensors, actuators, and electronics on a common substrate, such as a silicon substrate, through microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electromechanical devices.

A MEMS device includes small structures with dimensions in the micrometer scale (one millionth of a meter). Significant portions of the MEMS technology have been adopted from integrated circuit (IC) technology. For instance, similar to ICs, MEMS structures are, in general, realized in thin films of materials and patterned with photolithographic methods. Moreover, similar to ICs, MEMS structures are, in general, fabricated on a wafer by a sequence of deposition, lithography and etching.

With the increasing complexity of MEMS structures, the fabrication process of a MEMS device also becomes increasingly complex. For example, an array of MEMS probes may be assembled into a probe card. A probe card is an interface between an electronic test system and a semiconductor wafer under test. A probe card provides an electrical path between the test system and the circuitry on the wafer, thereby enabling the testing and validation of the circuitry at the wafer level, before the chips on the wafer are diced and packaged.

Conventionally, probes are fabricated on a single substrate that has multiple layers deep in the vertical direction (with respect to the surface of the substrate), using a sequence of deposition steps across an entire wafer. A concern with the conventional methodology is that a defect or contamination occurring in any deposition step and in any individual probe may cause the entire wafer to fail. Further, the designs of probe shapes are usually restricted by the conventional processes that deposit layers of probe materials in a direction along the longitudinal axis of the probe spring. These conventional processes create the vertical, multi-dimensional structure of a probe, using multiple lithographic steps to pile and connect every layer of probe materials. As a result, the final probe structure, including the probe spring, tends to have a jagged and uneven outline and lack smooth transitions among the layers. Thus, there is a need to improve the conventional fabrication process in order to increase the yield of MEMS probes, reduce the lead time and costs, and improve the design of the probes.

BRIEF DESCRIPTION OF THE DRAWINGS

One or more embodiments of the present invention are illustrated by way of example and not limitation in the figures of the accompanying drawings, in which like references indicate similar elements and in which:

FIGS. 5A-5B illustrate the formation of a probe body and a frame.

FIGS. 7A-7B illustrate the removal of the first sacrificial layer.

FIGS. 8A-8B illustrate an alternative process in which an opening is formed in the first sacrificial layer.

FIGS. 9A-9B illustrate the formation of the tip base and the frame in the alternative process.

FIGS. 11A-11B illustrate the formation of the probe body in the alternative process.

FIGS. 13A-13B illustrate the removal of the first sacrificial layer in the alternative process.

FIGS. 18(a)-(f) illustrate variations of probe designs.

FIGS. 19(a)-(e) illustrate additional variations of probe designs.

DETAILED DESCRIPTION

Figure 1A:
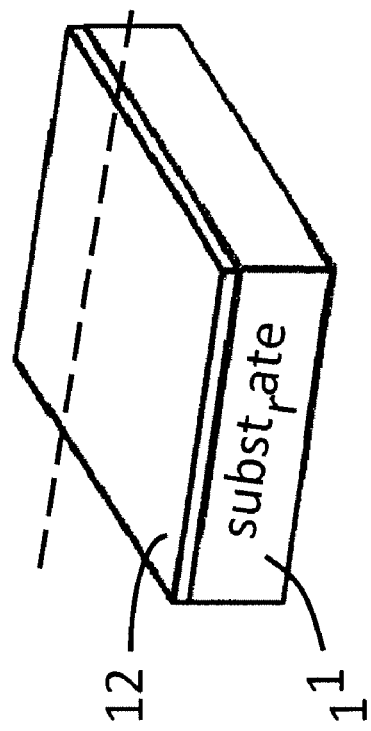
FIGS. 1A-1B illustrate a perspective view and a cross-section view of a substrate on which a conductive layer is formed.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

A technique for fabricating a Micro-Electro-Mechanical Systems (MEMS) probe on a substrate for use on another platform, such as a probe card, is described. In one embodiment, one or more probes are fabricated on a substrate using MEMS processing techniques. Each probe includes a contact tip and a probe body. The probe body further includes a tip portion, a spring portion and a base portion. The probe is formed in a "lying" position, which means that the probe body is lying on a plane parallel with the surface of the substrate. The probe is detached from the substrate by forming an undercut beneath the probe and breaking the base portion from an anchoring structure on the substrate. The probe is then attached to an application platform of a probe card. During the attachment process, the probe is lifted up to a "standing" position such that only the base portion of the probe body is attached to the application platform.

In one embodiment, a pick-and-place process is described. In a pick-and-place process, MEMS probes (or "probes") are individually detached ("picked") from a substrate, and then attached ("placed") to an application platform in an unpackaged state. This "pick-and-place" technique not only improves the yield of the probes, but also greatly increases the flexibility with respect to how the MEMS probes are fabricated and used. For example, the array of MEMS probes may be detached from the substrate concurrently, or one or more parts at a time. Each of the MEMS probes may be attached to the same or different application platforms. Further, the MEMS probes attached to the same application platform may be fabricated on the substrate in a first arrangement and then attached to the application platform in a second arrangement, where the first arrangement and the second arrangement may have different spacing between the MEMS probes, different orientations of the MEM probes, or a combination of both.

As MEMS probes are fabricated on a substrate different from the platform used for the final application, yield of the individual MEMS probes does not directly affect the yield of the final product. A selection process of acceptable MEMS probes may be performed before the MEMS probes are assembled on the probe cards. Defective MEMS probes may be discarded before the attachment process, or left on the substrate.

The term "MEMS probe" herein refers to a probe fabricated by MEMS technology. It is understood that the technique described herein can be applied to other MEMS parts (e.g., mechanical parts, optical parts, electrical parts, or the like). Typically, a MEMS part has dimensions ranging from 10×10×10 μm to 5000×5000×5000 μm. Examples of a MEMS part include a probe, a laser module, optical lenses, micro-gears, micro-resistors, micro-capacitors, micro-inductors, micro-diaphragms, micro-relays, micro-springs, waveguides, micro-grooves, and the like.

The term "substrate" herein refers to the substrate used in the probe fabrication process, without involvement in the operations of the probes and the probe card. Examples of a substrate for fabricating MEMS probes include, but are not limited to, ceramics, glasses, metal plates, plastic plates, and semiconductor (e.g., silicon (Si)) wafers. A non-silicon substrate, compared to a Si-based substrate, offers a larger number of standard sizes and is available as a thicker and non-circular standard substrate. Further, some non-silicon substrates are inert to most chemicals used during fabrication processes. Most substrates, including a Si-based substrate, can be processed with the MEMS parts thereon. Processed materials on the substrates can be later removed or dissolved without damaging the substrates. Therefore, the substrate for fabricating MEMS probes, as described herein, is a "reusable substrate," unless otherwise indicated. A reusable substrate can be reused for a next batch of MEMS probes fabrication after the MEMS probes are detached therefrom and residual substances are removed.

The term "application platform" herein refers to a part of a probe card which provides a platform to which the probes are attached, and electrically connects one or more (e.g., each) of the probes to a printed circuit board (PCB) that interfaces an electronic test system. An application platform may include, but is not limited to, semiconductor, glass, ceramics (e.g., low-temperature co-fired ceramics (LTCC), high-temperature co-fired ceramics (HTCC)), metal, other dielectric materials, organic materials, or any combinations of the above. In addition to MEMS probes, an application platform may include components such as electrical connection, electrical contact, electrical isolation, electrical grounding, integrated circuit (IC) module, application specific IC (ASIC) module, dielectric patterning, conducting opening definition, mechanical support, mechanical protection, thermal conduction, electrostatic discharge (ESD) protection, confinement for parts, and wire bonding pads.

It is understood that a probe card may include one or more MEMS probes fabricated from one or more reusable substrates. The MEMS probes attached to a probe card may be of different orientations, shapes, sizes and materials. The location of the probes on the probe card can be customized.

Referring to FIGS. 1-7, an embodiment of a process for fabricating a MEMS probe on a substrate is shown in both perspective views and cross-section views. All of the figures labeled with "A" show perspective views, and all of the figures labeled with "B" show cross-section views. Although only one MEMS probe is shown in the figures, it is understood that the same process can be applied to the fabrication of an array of MEMS probes. Some standard or routine processing operations that are not directly relevant to the subject matter of the present invention, but are easily understood by a person of ordinary skill in the art, may be omitted from the following descriptions.

Figure 1B:
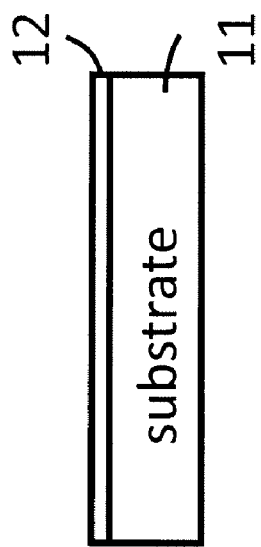

FIGS. 1A and 1B show a blanket metal layer 12 (e.g., gold or other conductive material(s)) formed on a substrate 11. To improve adhesion to substrate 11, in one embodiment, the bottom of blanket metal layer 12 may be coated with a thin film (e.g., less than 1 micron, not shown), also referred to as a seed layer, that is made of a conductive material (e.g., a combination of chromium and gold) different from that of blanket metal layer 12. In one embodiment, blanket metal layer 12 is deposited by an electrical forming process (also know as electrodeposition), such as electrode plating. The seed layer is formed by a thin film deposition process, which can be thermal evaporation, e-beam evaporation, sputtering deposition, or the like.

Figure 2A:
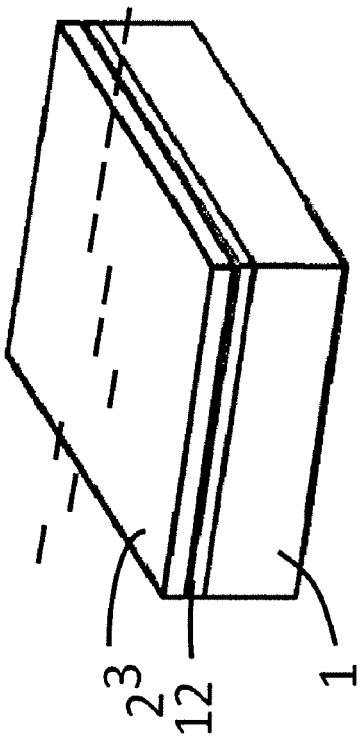
FIGS. 2A-2B illustrate a first sacrificial layer applied to the conductive layer.
Figure 2B:
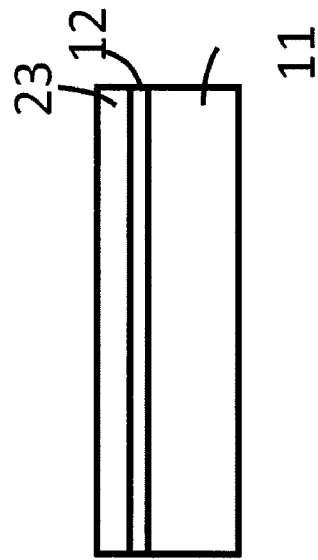

Following the formation of blanket metal layer 12, a first sacrificial layer 23 is formed on metal blanket layer 12 (FIGS. 2A and 2B). First sacrificial layer 23 is a layer of metal (e.g., copper) or alloy, different from blanket metal layer 12 and the probe to be formed on substrate 11. One way to form first sacrificial layer 23 is by electrical forming. In subsequent processing operations to be described below, first sacrificial layer 23 is to be removed from beneath the probe. In some embodiments, first sacrificial layer 23 may be planarized before further processing operations are performed. Planarization may be performed by a machine, such as a lapping machine, a diamond fly-cutter, or the like.

Figure 3B:
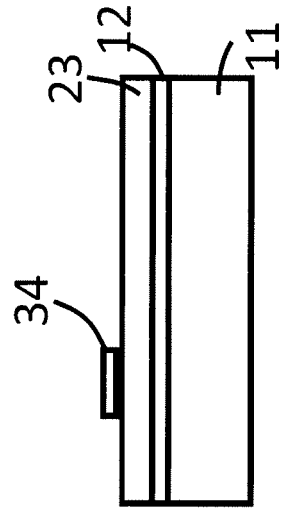
FIGS. 3A-3B illustrate a tip base formed on the first sacrificial layer.
Figure 3A:
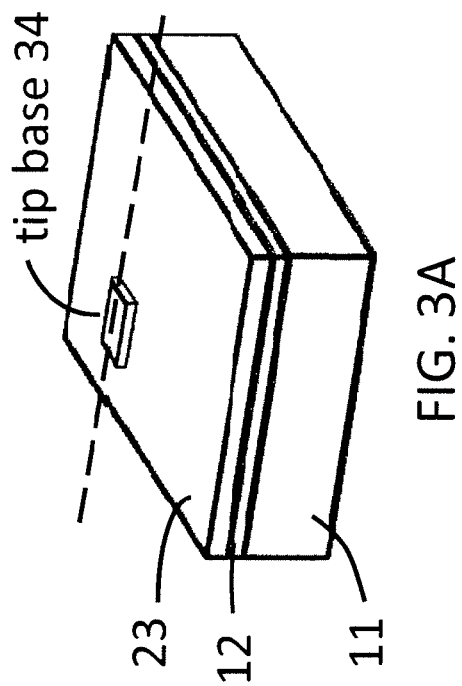

FIGS. 3A and 3B show a tip base 34 formed on top of first sacrificial layer 23. In one embodiment, tip base 34 is formed by using a first lithographic patterned mold (e.g., a photoresist mold) (not shown) to define the shape of tip base 34. The first lithographic patterned mold is placed on first sacrificial layer 23 and filled, by electrical forming, with a metal (e.g., nickel) or alloy material. The first lithographic patterned mold is to be removed in a subsequent processing operation, e.g., after tip base 34, the contact tip of the probe, or the probe is formed.

Figure 4B:
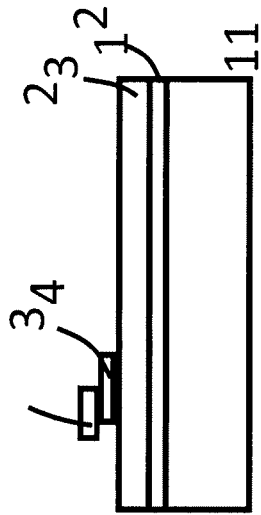
FIGS. 4A-4B illustrate a contact tip formed on the tip base.
Figure 4A:
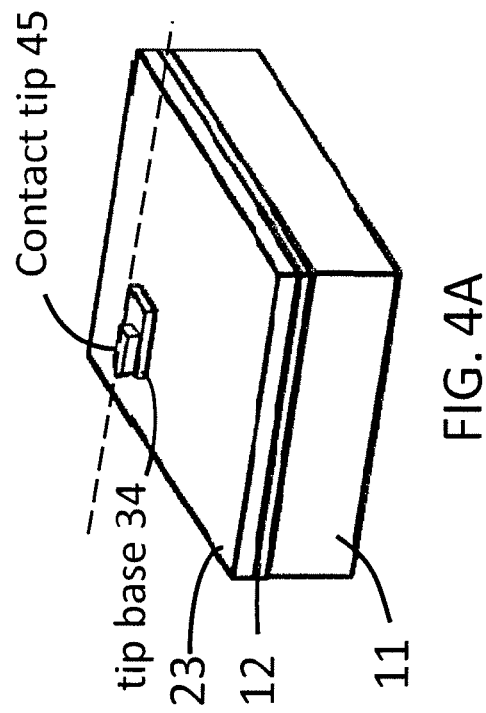

FIGS. 4A and 4B show a contact tip 45 formed on tip base 34, with a portion of contact tip 45 protruding from tip base 34. In one embodiment, contact tip 45 is formed by using a second lithographic patterned mold (e.g., a photoresist mold) (not shown) to define the shape of contact tip 45. The second lithographic patterned mold is filled, by electrical forming, with a metal (e.g., rhodium) or alloy material different from the material of tip base 34. The second lithographic patterned mold is also to be removed in a subsequent processing operation, e.g., after contact tip 45 or the probe is formed.

Referring to FIG. 5A, tip base 34 and contact tip 45 are part of a probe 51 formed on substrate 11. After the formation of tip base 34 and contact tip 45, the rest of probe 51 and a frame 57 attaching to probe 51 are formed on substrate 11. In an embodiment where both tip base 34 and the rest of probe 51 (excluding contact tip 45) are formed by the same material (e.g., nickel), tip base 34 becomes part of probe 51 and is not explicitly shown in FIG. 5A.

On substrate 11, probe 51 is formed in a "lying" position, which means that probe 51 is lying on a plane parallel with the surface of substrate 11. FIG. 5B shows the cross-section view of probe 51 along axis (I) and axis (II). In the "lying" position, a thickness dimension, t, of probe 51 is shown to be perpendicular to the surface of substrate 11. Axis (I) extends along the longitudinal direction of an elongated section of probe 51, referred to as a probe base 58. A surface of probe base 58, referred to as a bonding surface 59, lies on a plane along the thickness dimension and is perpendicular to the surface of substrate 11. Axis (II) extends from probe base 58 to contact tip 45 and is parallel with the surface of substrate 11. This "lying" position is opposed to a "standing" position when probe 51 is attached to an application platform of a probe card. In the "standing" position, bonding surface 59 is attached to the surface of the application platform, while contact tip 45 is lifted up such that axis (II) goes through the surface of the application platform.

In one embodiment, a thin metal film (e.g. gold) can be deposited at this point on the bonding surface 59 for the purpose of improving adhesion between probe base 58 to the surface of the application platform.

Frame 57 (also referred to as an "island" or an "anchoring structure") is used to anchor probe 51 to a fixed location on substrate 11. In a subsequent operation that removes first sacrificial layer 23 beneath probe 51, frame 57 becomes the only support for probe 51 to remain on substrate 11. In one embodiment, the surface area of frame 57 is greater than that of probe 51. Representatively, a surface area ratio of frame 57 to probe 51 ranges from 25:1 (or more) to 2:1 (or less). Theoretically, there is no upper bound on this surface area ratio. However, a large surface area ratio means a large frame 57 on substrate 11, and, therefore, less space for probes. Further, the surface area ratio may depend on the relative shapes of frame 57 and probe 51. For example, the surface area ratio may be greatly reduced (e.g., 5:1, 2:1, 1:1, or less) if frame 57 has a substantially round shape and probe 51 has a long and narrow shape. In some embodiments, a round-shaped frame 57 may have less surface area than a long and narrow probe 51. The surface area ratio may increase (e.g., greater than 1:1, 5:1, 7:1, 10:1 or greater) if both frame 57 and probe 51 have a substantially same shape. The surface area ratio and the relative shapes (of frame 57 and probe 51) contribute to the differential etching rates of first sacrificial layer 23 underneath probe 51 and frame 57, which is a feature that facilitates the detachment of probe 51, as will be described in detail later with reference to FIGS. 7A and 7B.

Probe 51 (excluding tip base 34 and contact tip 45) and frame 57 may be formed by using a third lithographic patterned mold (not shown) that defines the shapes of probe 51 and frame 57. The third lithographic patterned mold is filled, by electrical forming, with a conductive material, such as a metal (e.g., nickel) or alloy. In some embodiments, the first, second and third lithographic patterned molds may be made of the same materials, such as photoresist, or different materials.

The third lithographic patterned mold also defines the shape of an anchoring joint 52 between probe base 58 and frame 57. Anchoring joint 52 is shaped to have deep V-cuts on both sides of the joint section that connects probe base 58 and frame 57. The cross-section of anchoring joint 52 (defined by a plane that cuts through the joint section of probe base 58 and frame 57) is a thin and narrow area. For example, anchoring joint 52 is shaped to have deep V-cuts on both sides, such that its cross-section has substantially the shape of a line, which extends along the thickness of the probe layer. As will be described in greater detail below with respect to FIGS. 7A and 7B, the shape of anchoring joint 52 facilitates the detachment of probe 51 from frame 57 by external force.

Figure 6B:
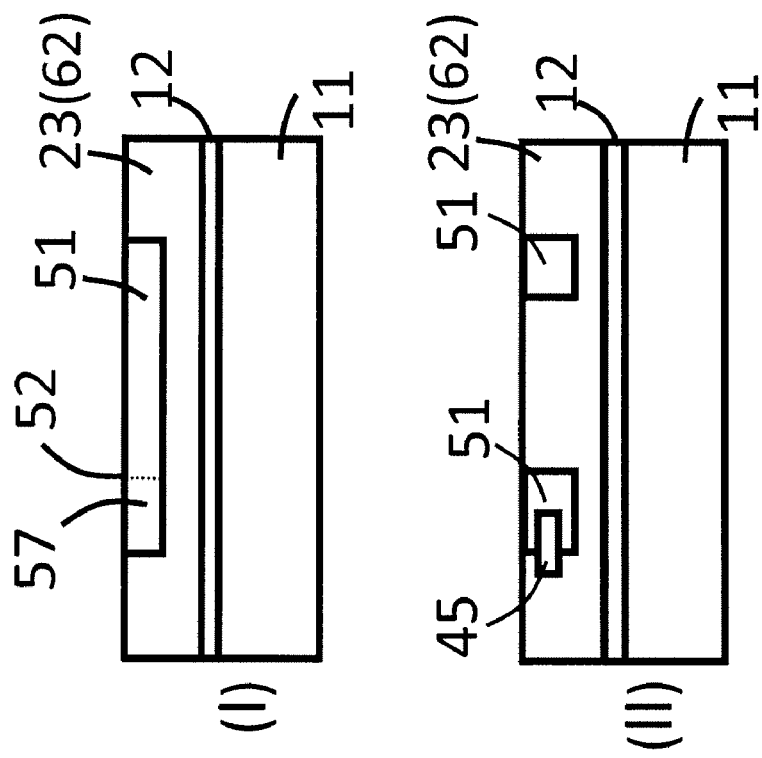
FIGS. 6A-6B illustrate a second sacrificial layer formed on the probe in a planarization process.
Figure 6A:
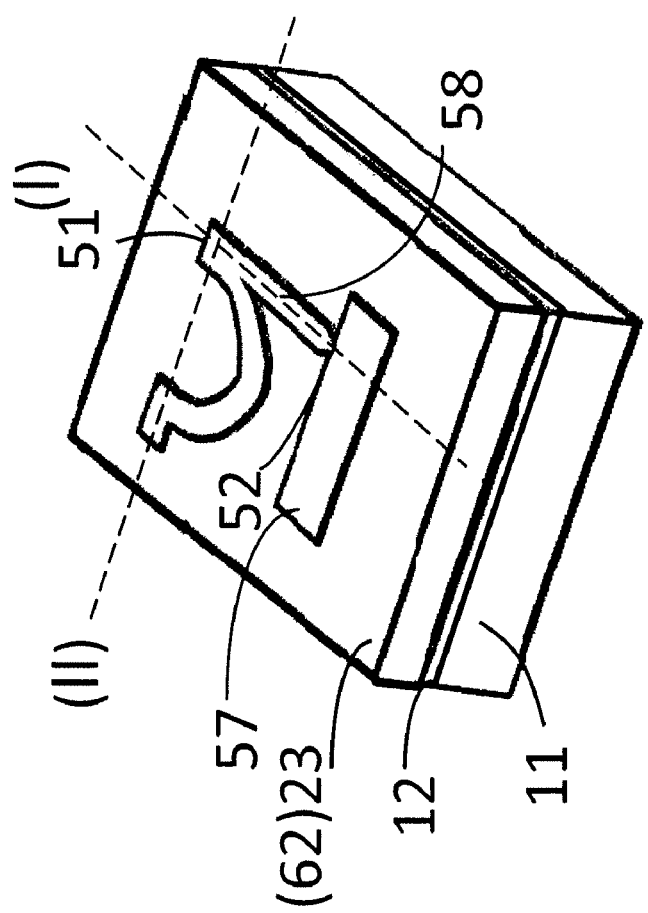

After the formation of probe 51, a planarization operation is performed on probe 51 to control the thickness of probe 51 (FIGS. 6A and 6B). Frame 57 may be planarized with probe 51 at the same time. When multiple probes are fabricated at the same time on substrate 11, planarization can be performed to produce substantially equal thickness (within the design specification) across all of the probes on substrate 11. Planarization may produce a shear force on probe 51 to cause damage to probe 51. To prevent the potential damage, the third lithographic patterned mold may be kept on substrate 11 during the planarization, and stripped or dissolved away after the planarization. Alternatively, the third lithographic patterned mold is removed after the formation of probe 51, and a second sacrificial layer 62 is applied as a blanket layer over probe 51 and the exposed surface of substrate 11. Second sacrificial layer 62 may be made of the same material as any of the previous-applied lithographic patterned molds, the same conductive material as first sacrificial layer 23 (e.g., copper or alloy), or photoresist. In the embodiment shown in FIGS. 6A and 6B, second sacrificial layer 62 is the same material as first sacrificial layer 23.

After the planarization operation, second sacrificial layer 62 is stripped or dissolved. In one embodiment where second sacrificial layer 62 is made of the same material as first sacrificial layer 23, both of the first and second sacrificial layers 23, 62 can be selectively etched or dissolved from beneath probe 51. The selective removal creates an undercut 73 beneath probe 51 (FIGS. 7A and 7B). As described above, the surface areas and/or the shapes of frame 57 and probe 51 (as shown in FIG. 5A) enables first sacrificial layer 23 underneath probe 51 to be etched faster than first sacrificial layer 23 underneath frame 57. When first sacrificial layer 23 is completely removed from underneath the probe 51, there remains a substantial amount of first sacrificial layer 23 underneath frame 57 to hold frame 57 on substrate 11. At this point, probe 51 is held in place, by frame 57 only, at anchoring joint 52.

As mentioned above, a thin metal film (e.g., gold) can be deposited, before the planarization operation, on bonding surface 59 for the purpose of improving adhesion between probe base 58 to the surface of the application platform. In an alternative embodiment, the thin metal film may be deposited at this point instead of before the planarization operation.

After the creation of undercut 73, probe 51 is ready to be detached from frame 57 manually or with a machine. A lateral force (with respect to the surface of substrate 11) applied to probe 51 near anchoring joint 52 can separate probe 51 from frame 57 right at anchoring joint 52. Alternatively, an upward swing force can be applied to or near anchoring point 52 to separate probe 51 from frame 57. Yet another way of separating probe 51 from frame 57 is by laser cutting anchoring joint 52. Substrate 11 is left with frame 57 after all probes 51 are detached. Substrate 11 can be reused for fabrication of a next batch of probes by continuing etching or dissolving first sacrificial layer 23 until frame 57 is separated from substrate 11. Substrate 11 can then be reused with blanket metal layer 12 or the thin film at the bottom of blanket metal layer 12, which remain on substrate 11.

The detachment of probe 51 can be performed by external force at or near anchoring joint 52, with respect to the surface of substrate 11. The external force, either laterally or upward, or by laser cutting, physically breaks the narrow connection at anchoring joint 52. After the narrow connection is broken, a "broken" surface is formed on the side of probe base 58 that was previously connected to frame 57. This broken surface is distinguishable from a surface defined by conventional methods of probe formation that does not use external force to detach a probe from the substrate. In general, a surface formed by conventional methods is smooth and regularly shaped. A surface formed by forcibly breaking (such as the broken surface of probe base 58) is generally rough and substantially irregular. A person of ordinary skill in the art would be able to recognize this "signature" represented by the broken surface by examining the smoothness and shape of the surface. In a scenario where probe 51 is made of metal, the roughness and irregularity of a broken metal surface is visually discernable and distinguishable from a plated metal surface defined by photoresist or other sacrificial materials.

An alternative process to the one described in FIGS. 2-7 is explained below with reference to FIGS. 8-13. In FIGS. 8A and 8B, after blanket metal layer 12 is formed on substrate 11, a photoresist pattern of opening 81 is formed before first sacrificial layer 23 is electrically formed. After first sacrificial layer 23 is formed, the photoresist is stripped to expose, through an opening 81, blanket metal layer 12 or a thin film (also referred to as a seed layer, not shown) at the bottom of blanket metal layer 12. A first lithographic patterned mold (not shown) is used to define the shape of tip base 34 and frame 92 (FIGS. 9A and 9B). Frame 92 is different from frame 57 (FIGS. 5A and 5B) in that frame 92 has direct contact with blanket metal layer 12 or the seed layer at the bottom of blanket metal layer 12, while frame 57 is formed on top of first sacrificial layer 23 without direct contact with blanket metal layer 12 or the seed layer. In one embodiment, frame 92 and tip base 34 are formed, by electrical forming, for the same period of time. Thus, the thickness of tip base 34 and frame 92 is substantially the same. As the side area of frame 92 is formed on top of first sacrificial layer 23 and the center area of frame 92 is formed on top of blanket metal layer 12 or the seed layer of blanket metal layer 12, the center area of frame 92 forms a recess 93. In some embodiments, recess 93 may be removed by planarization.

Figure 10B:
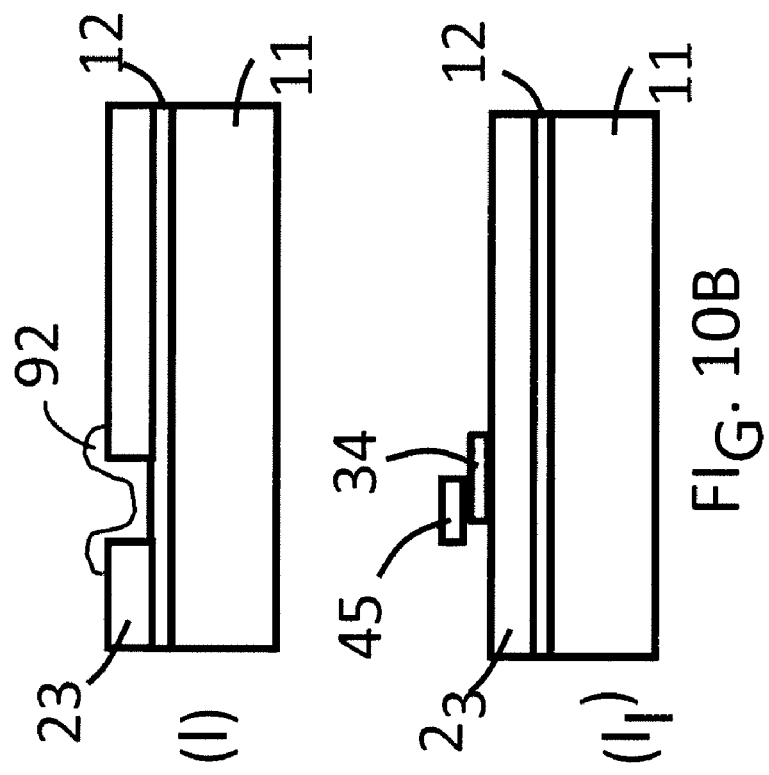
FIGS. 10A-10B illustrate the formation of the contact tip in the alternative process.
Figure 10A:
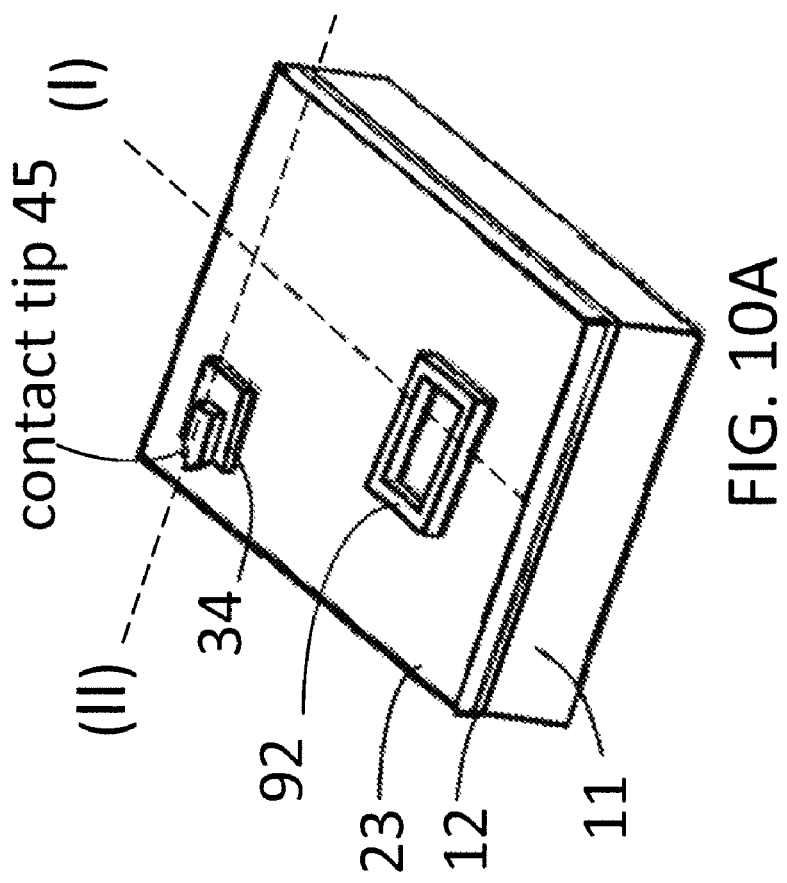

FIGS. 10A and 10B show that contact tip 45 is formed on top of probe base 34. FIGS. 11A and 11B show that the rest of probe 51 is formed with frame 92 attaching to probe 51. As described in the process of FIGS. 4 and 5, a second lithographic patterned mold and a third lithographic patterned mold (not shown) may be used to form contact tip 45, probe 51 and frame 92. Frame 92 at this point is anchored to blanket metal layer 12 or the seed layer at the bottom of blanket metal layer 12. Additional processes may be performed to apply a metal thin film (e.g., gold) to the bonding surface 59 of probe base 58 for the purpose of improving adhesion between probe base 58 to the surface of the platform of the probe card.

Figure 12B:
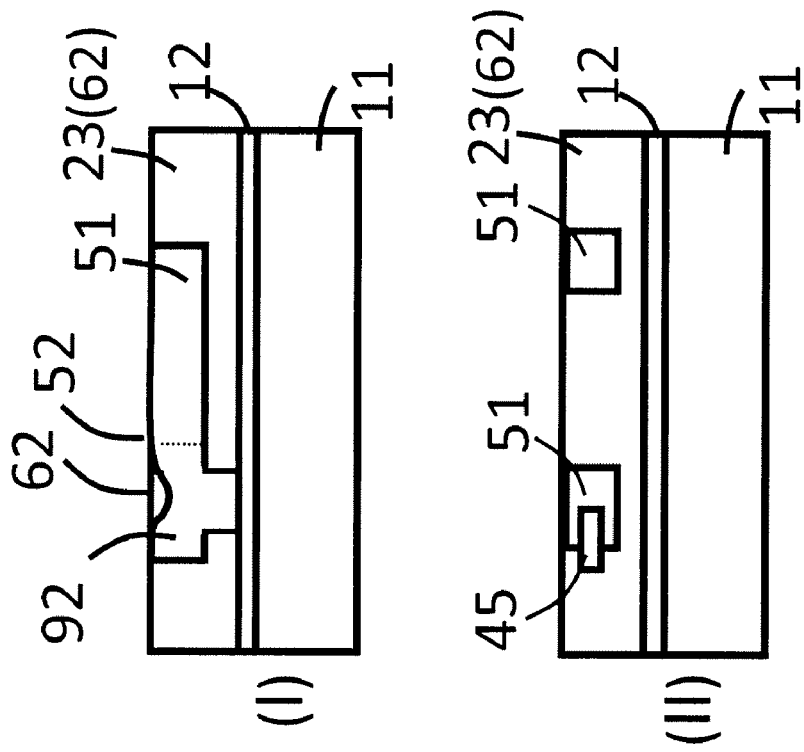
FIGS. 12A-12B illustrate a planarization process in the alternative process.
Figure 12A:
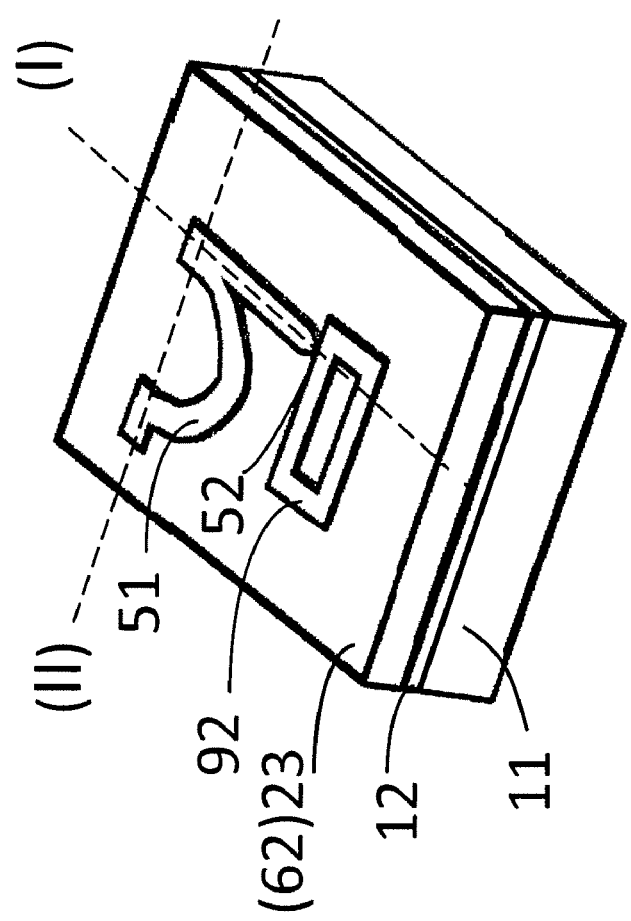

FIGS. 12A and 12B show the planarization of the probe surface with the use of second sacrificial layer 62, which, in this embodiment, is made of the same material as first sacrificial layer 23. As mentioned above with reference to FIGS. 6A and 6B, second sacrificial layer 62 may alternatively be made of photoresist, or the same material as any of the previously-applied lithographic patterned molds. After the planarization, first sacrificial layer 23 and second sacrificial layer 62 are removed, e.g., by chemical etching or dissolving (FIGS. 13A and 13B). The etching or dissolving time can be much longer than the process described in FIGS. 7A and 7B, until all of the sacrificial material is etched or dissolved. There is no critical timing to stop the etching or dissolving, as in the process described in FIGS. 7A and 7B, to prevent complete removal of first sacrificial layer 23 from underneath frame 57. With this alternative process, frame 92 is anchored to blanket metal layer 12 or the seed layer at the bottom of blanket metal layer 12, so complete removal of first sacrificial layer 23 does not create a problem. The removal of first sacrificial layer 23 creates an undercut 37 beneath probe 51. Similar to the process described in FIGS. 7A and 7B, probe 51 can be detached from frame 92 by applying a physical force. Substrate 11 can be reused after frame 92 is etched or dissolved away.

Figure 14:
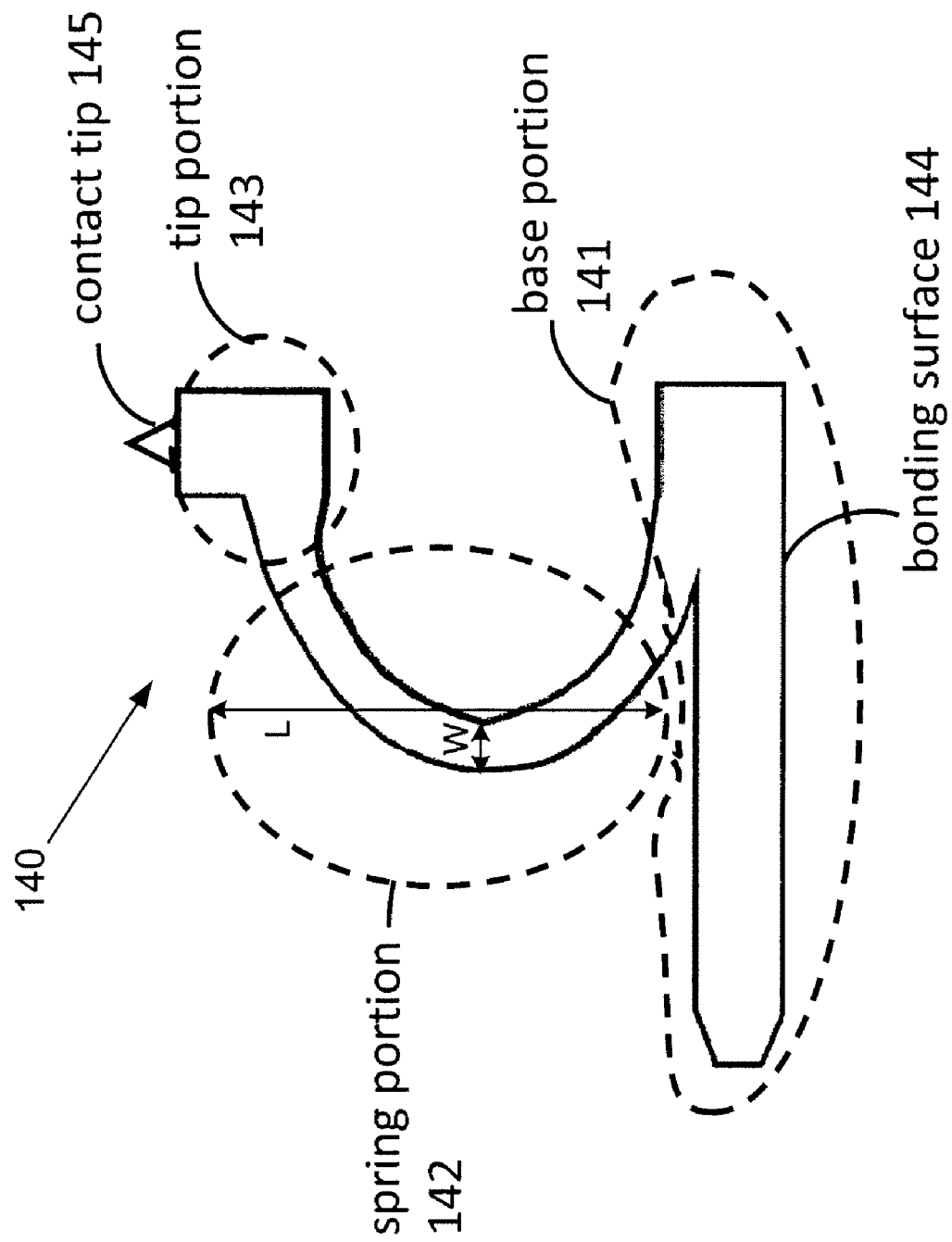
FIG. 14 illustrates a structure of a probe.

Referring to FIG. 14, the basic structure of a probe 140 (e.g., probe 51) includes a contact tip 145 and a probe body. The probe body further includes three main portions, a base portion 141, a spring portion 142 and a tip portion 143. Base portion 141 mechanically supports the rest of the probe structure and includes a bonding surface 144 at the bottom for attachment to a probe card. Spring portion 142 is designed to have a spring constant as specified by customer's requirements. Tip portion 143 supports contact tip 145 to form a contact to the device-under-test (DUT). All of the three portions (141, 142 and 143) and contact tip 145 can be customized to satisfy the requirements of different applications.

Spring portion 142 reacts with a buckling force to a pressure applied on tip portion 143. In one embodiment, spring portion 142 has a shape of a fraction of a circle or a deformed circle (e.g., a half circle, a half ellipse, a quarter ellipse, or a quarter circle), with one end extended to tip portion 143 and the other end anchored to base portion 141. Spring portion 142 can also be designed such that its width (shown as "W" in FIG. 14) varies along the spring length (shown as "L") to result in an optimized scrubbing mark. As the shape of spring portion 142 is defined by one lithographic mold (the third lithographic patterned mold as described above) and formed in one lithographic operation (e.g., the processes described in FIGS. 5 and 11 above), the shape of spring portion 142 can be designed to have smooth curves or other geometrical shapes in the vertical direction (with respect to the surface of the probe card). Conventional processes create a spring vertically with respect to the surface of the probe card. Thus, multiple lithographic operations are necessary to pile and connect every layer that forms the spring. The final spring structure becomes jagged and has no smooth transition among the layers.

Figure 15B:
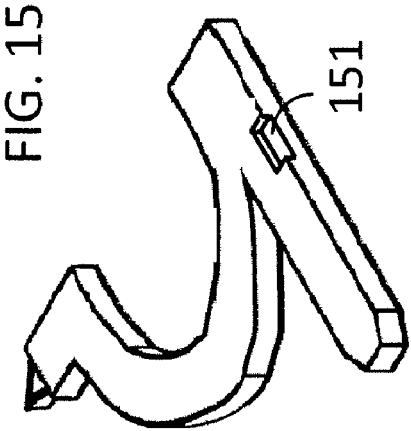
FIGS. 15A-15B illustrates probes having thickness variation in the base portion.
Figure 15A:
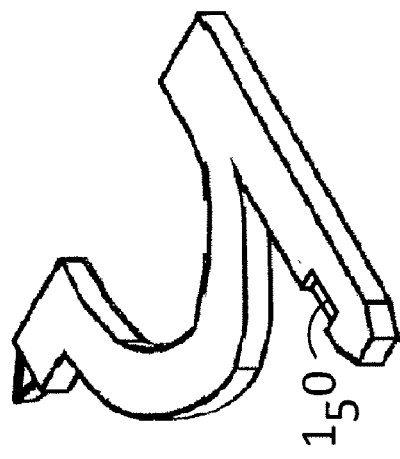

The probe structure described herein is formed by at least three separate lithographic processes that form the tip base, the contact tip, and the rest of the probe body. The three lithographic processes allow the probe body to have thickness variations along its cross sections, wherein the thickness is measured in a direction perpendicular to the surface of substrate 11. For example, during the formation of the tip base, a metal or alloy material can be deposited in a recess section 150 of the probe body (FIGS. 15A and 15B). When electrically forming the probe body, section 150 is covered with photoresist. After the photoresist is stripped, section 150 ends up having a thickness of the tip base layer only. Thus, one can have a "thin" section in the base portion for easy mechanical gripping (FIG. 15A). Similarly, recess section 151 of FIG. 15B can be formed to confine the bonding material when the probe is bonded to the application platform of the probe card. More lithographic steps can be introduced to further increase thickness variation along the probe if necessary.

Figure 17:
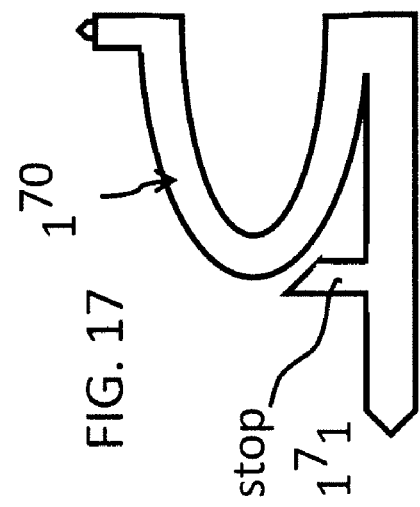
FIG. 17 illustrates a probe having two stages of spring reactions.
Figure 16:
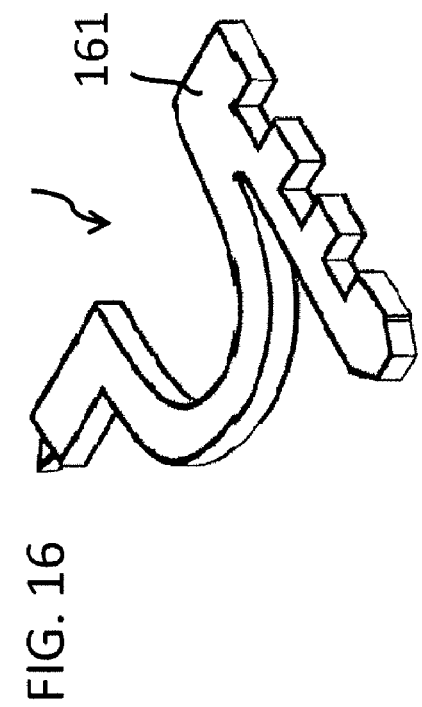
FIG. 16 illustrates a probe having a corrugated base.

The base portion of a probe can vary in design to meet the requirements of different applications. For example, in FIG. 16, a probe 160 has a base portion 161 that is "corrugated" to improve the fitting and bonding to the application platform, which may have a counterpart corrugated design. In one embodiment shown in FIG. 17, a probe 170 has a stop 171 to provide two stages of buckling reactions. Initially, when the tip end of probe 170 was pressured downward, the whole spring of probe 170 reacts with an entire buckling force. If the downward pressure continues such that stop 171 hits the spring portion of probe 170, only the top part of the spring portion reacts to the downward pressure. The two stages of buckling reactions produce different combination of vertical and lateral motions at the tip portion of probe 170. The lateral and vertical motions of the tip portion, in turn, produce a scrubbing mark on the device-under-test (DUT).

A person of ordinary skill in the art would appreciate that a desired buckling force can be produced by adjusting design factors such as probe height, probe thickness, stop position and stop gap (which is the gap or distance between stop 171 and spring portion of probe 170). Additional examples of probe springs include a buckling spring (FIG. 18(a)), a snake shape spring (FIG. 18(b)), a square spring (FIG. 18(c)), a curve-up spring (FIG. 18(d)), a curve-down spring (FIG. 18(e)), and two-spring probe (FIG. 18(f)). FIGS. 19(a)-(e) illustrate more spring shapes that can be fabricated by the process described herein.

A scrubbing mark is generally characterized by the length and depth of the mark on the DUT. Referring again to FIG. 14, to produce a desired scrubbing mark, the shape of contact tip 145 can be designed such that the scrubbing mark is optimized according to a specific application. Contact tip 145 is designed to be "sandwiched" by the metal layers of the probe body with a contact area exposed. The contact area has two parallel opposing sides (i.e., the upper and lower sides with respect to the surface of substrate 11 of FIG. 11A). The front scrubbing edge of the contact area may have a sharp, pointed angle suitable for forming a desired scrubbing mark. In one embodiment, the lithographic mold that is used for forming contact tip 45 (as in the processes described above with reference to FIGS. 4 and 10) can be designed such that the front scrubbing edge of contact tip 45 has a radius of curvature that is optimized for producing appropriate scrubbing pressure for probe card applications.

Thus, a technique for fabricating a MEMS probe on a substrate has been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A method comprising:
   forming a probe on a substrate using Micro-Electro-Mechanical Systems (MEMS) processing techniques, the probe having a bonding surface to be attached to an application platform of a probe card, the bonding surface formed on a plane perpendicular to a surface of the substrate;
   forming an undercut beneath the probe for detachment of the probe from the substrate;
   detaching the probe from the substrate by breaking a joint located between a base portion of probe and an anchoring structure on the substrate, wherein detaching the probe from the substrate further comprises:
   forming a sacrificial layer on the substrate;
   forming the probe and the anchoring structure on the sacrificial layer; and
   removing the sacrificial layer beneath the probe without completely removing the sacrificial layer beneath the anchoring structure.

2. The method of claim 1, wherein the anchoring structure has a surface area greater than that of the probe.

3. The method of claim 1, wherein the anchoring structure has a substantially round shape and the probe has a substantially long and narrow shape.

4. The method of claim 1, wherein the probe comprises:
   a contact tip to form a contact with a device-under-test, the contact tip sandwiched between two conductive layers of the probe;
   a probe body, which comprises:
      a tip portion to support the contact tip;
      a spring portion; and
      the base portion to support the tip portion and the spring portion, the base portion having an exposed broken surface that is formed by detaching the probe with force from the substrate.

5. The method of claim 4, wherein the probe body has thickness variations in its cross sections, the thickness measured in a direction perpendicular to a surface of the substrate.

6. The method of claim 4, wherein the spring portion has one or more curved shapes and a width that varies along a length of the spring portion, with a first end of the spring portion extending to the tip portion and a second end connecting to the base portion.

7. The method of claim 4, wherein the spring portion includes more than one curved springs connected in parallel.

8. The method of claim 4, wherein the spring portion provides a buckling force that has two stages with a stop between the two stages.

9. The method of claim 1, wherein the base portion is corrugated.

10. The method of claim 1, wherein the substrate is reusable for fabricating a next batch of probes.

11. A method comprising:
   forming a probe on a substrate using Micro-Electro-Mechanical Systems (MEMS) processing techniques, the probe having a bonding surface to be attached to an application platform of a probe card, the bonding surface formed on a plane perpendicular to a surface of the substrate;
   forming an undercut beneath the probe for detachment of the probe from the substrate;
   detaching the probe from the substrate by breaking a joint located between a base portion of probe and an anchoring structure on the substrate, wherein detaching the probe from the substrate further comprises:
   forming a conductive layer on the substrate;
   forming a sacrificial layer on the conductive layer, the sacrificial layer having an opening to expose the conductive layer;
   forming the probe and the anchoring structure on the sacrificial layer, the anchoring structure having contact to the conductive layer through the opening; and
   removing the sacrificial layer beneath the probe.

12. The method of claim 11, wherein the anchoring structure has a surface area greater than that of the probe.

13. The method of claim 11, wherein the anchoring structure has a substantially round shape and the probe has a substantially long and narrow shape.

14. The method of claim 11, wherein the probe comprises:
   a contact tip to form a contact with a device-under-test, the contact tip sandwiched between two conductive layers of the probe;
   a probe body, which comprises:
      a tip portion to support the contact tip;
      a spring portion; and the base portion to support the tip portion and the spring portion, the base portion having an exposed broken surface that is formed by detaching the probe with force from the substrate.

15. The method of claim 14, wherein the probe body has thickness variations in its cross sections, the thickness measured in a direction perpendicular to a surface of the substrate.

16. The method of claim 14, wherein the spring portion has one or more curved shapes and a width that varies along a length of the spring portion, with a first end of the spring portion extending to the tip portion and a second end connecting to the base portion.

17. The method of claim 14, wherein the spring portion includes more than one curved springs connected in parallel.

18. The method of claim 14, wherein the spring portion provides a buckling force that has two stages with a stop between the two stages.

19. The method of claim 11, wherein the base portion is corrugated.

20. The method of claim 11, wherein the substrate is reusable for fabricating a next batch of probes.

\* \* \* \* \*